(12) United States Patent
Zoschke et al.

(10) Patent No.: US 10,134,707 B2
(45) Date of Patent: Nov. 20, 2018

(54) BONDING METHOD FOR CONNECTING TWO WAFERS

(71) Applicant: Fraunhofer-Gesellschaft zur Förderung der angewandten Forschung e.V., München (DE)

(72) Inventors: Kai Zoschke, Berlin (DE); Michael Töpper, Berlin (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 15/429,669

(22) Filed: Feb. 10, 2017

(65) Prior Publication Data

US 2017/0236799 A1 Aug. 17, 2017

(30) Foreign Application Priority Data

Feb. 12, 2016 (DE) .......................... 10 2016 202 174

(51) Int. Cl.
*B32B 3/02* (2006.01)
*H01L 23/00* (2006.01)
(Continued)

(52) U.S. Cl.
CPC ............... *H01L 24/83* (2013.01); *B32B 7/14* (2013.01); *B32B 37/1292* (2013.01); *H01L 24/27* (2013.01); *H01L 24/32* (2013.01); *H01L 24/94* (2013.01); *B32B 2250/02* (2013.01); *B32B 2255/26* (2013.01); *B32B 2255/28* (2013.01); *B32B 2323/00* (2013.01);
(Continued)

(58) Field of Classification Search
CPC ......... H01L 24/27; H01L 24/32; H01L 24/83; B32B 7/14; B32B 37/1292; B32B 2250/02; B32B 2250/26; B32B 2250/28
See application file for complete search history.

(56) References Cited

U.S. PATENT DOCUMENTS

2008/0308922 A1 12/2008 Zhang et al.
2012/0220080 A1 8/2012 Watanabe et al.
(Continued)

FOREIGN PATENT DOCUMENTS

DE 10297225 T5 11/2004

OTHER PUBLICATIONS

"German Application Serial No. 10 2016 202 174.5, Examination Report dated Oct. 4, 2016", w/ English Translation, (Oct. 4, 2016), 13 pgs.
(Continued)

*Primary Examiner* — Elizabeth E Mulvaney
(74) *Attorney, Agent, or Firm* — Schwegman Lundberg & Woessner, P.A.

(57) ABSTRACT

The present invention relates to a bonding method for connecting a first wafer and a second wafer, wherein firstly a first adhesive layer is deposited onto a surface of the first wafer. Furthermore, a second adhesive layer is deposited onto the first adhesive layer, and the two adhesive layers are structured by way of selective removal of both adhesive layers in at least one predefined region of the first wafer, Moreover, the first wafer is connected to the second wafer by way of pressing a surface of the second wafer onto the second adhesive layer, wherein the second adhesive layer is more flowable that the first adhesive layer on connecting the first wafer to the second wafer.

16 Claims, 2 Drawing Sheets

(51) Int. Cl.
  *B32B 7/14* (2006.01)
  *B32B 37/12* (2006.01)
(52) U.S. Cl.
  CPC ..... *B32B 2457/14* (2013.01); *H01L 2224/279* (2013.01); *H01L 2224/2731* (2013.01); *H01L 2224/27416* (2013.01); *H01L 2224/27418* (2013.01); *H01L 2224/27436* (2013.01); *H01L 2224/27515* (2013.01); *H01L 2224/27632* (2013.01); *H01L 2224/29007* (2013.01); *H01L 2224/29011* (2013.01); *H01L 2224/2919* (2013.01); *H01L 2224/29082* (2013.01); *H01L 2224/32145* (2013.01); *H01L 2224/32148* (2013.01); *H01L 2224/8385* (2013.01); *H01L 2224/83139* (2013.01); *H01L 2224/83191* (2013.01); *H01L 2224/83193* (2013.01); *H01L 2224/83201* (2013.01); *H01L 2224/83203* (2013.01); *H01L 2224/83856* (2013.01); *H01L 2224/83862* (2013.01); *H01L 2224/83874* (2013.01); *H01L 2224/83905* (2013.01); *H01L 2224/94* (2013.01)

(56) References Cited

U.S. PATENT DOCUMENTS

2014/0147986 A1   5/2014   Dang et al.
2015/0035554 A1   2/2015   Dang et al.

OTHER PUBLICATIONS

"European Application Serial No. 17155432.2 Extended Search Report dated Oct. 2, 2017", w/English Translation, (dated Oct. 2, 2017), 20 pgs.

"European Application Serial No. 17155432.2, Partial Search Report dated Jul. 12, 2017", (dated Jul. 12, 2017), 39 pgs.

Baumgartner, Tobias, et al., "Fabrication of 3-D microstructures with permanent dielectric dry film", 42nd International Symposium on Microelectronics, (2009), 99-103.

McMahon, J. J., et al., McMahon, J. J., J-Q. Lu, and R. J. Gutmann. "Wafer bonding of damascene-patterned metal/adhesive redistribution layers for via-first three-dimensional (3D) interconnect", Electronic Components and Technology Conference, 2005. Proceedings. 55th. IEEE, (2005), 331-336.

Oberhammer, Joachim, et al., "Selective wafer-level adhesive bonding with benzocyclobutene for fabrication of cavities", Sensors and Actuators A: Physical 105.3, (2003), 297-304.

Zoschke, Kai, "Evolution of structured adhesive wafer to wafer bonding enabled by laser direct patterning of polymer resins", Electronics Packaging Technology Conference (EPTC), 2016 IEEE 18th. IEEE, (2016), 223-228.

BONDING METHOD FOR CONNECTING TWO WAFERS

RELATED APPLICATION

This application claims priority to German Patent Application Number 10 2016 202 174.5, entitled "KLEBEVERFAHREN ZUM VERBINDEN ZWEIER WAFER," filed on Feb. 12, 2016, which is incorporated herein by reference in its entirety.

FIELD

The present application relates to a method for connecting a first and a second wafer, wherein the two wafers are connected by way of a structured double adhesive layer.

BACKGROUND

Circuit carriers or substrates such as silicon wafers, glass wafers or ceramic wafers need to be connected to one another by way of adhesive layers, for the manufacture of some micro-electronic components. These adhesive layers are typically deposited onto one of the two wafers to be connected, firstly as a layer over the whole surface, and if necessary, structured there, for example by way of a photolithographic structuring method. The connecting or joining process is then based on pressing the two wafers to be connected, onto one another, and the application of pressure upon the adhesive layer located between the wafers, which this pressing-together entails. An increased temperature can yet additionally be applied during the connecting, by way of which the adhesive layer is plastically deformed and adapts as best as possible to the surface topology of the wafer, for establishing cavity-free connections.

SUMMARY

The adhesive layer must also have a certain flowability even after its structuring, which permits the material to be pressed into the prevailing surface topography and to compensate this out when applying pressure, so as to permit such joining methods. If the flowability of the adhesive layer is too high and/or the adhesive layer is too thick, then relative movements between the wafers can occur. Here, there exists the danger of the produced adhesive structure of the structured adhesive layer greatly deforming or even being completely destroyed, in the case of a large relative movement.

If adhesive structures of a certain height of several micrometers or more for example are to be produced for creating a certain distance between the wafers to be connected, for example for compensating surface topographies of one or both wafers, then this has been found to be quite difficult with the application of a well flowable material, since the adhesive structures hence deform on connecting, which results in an adhesive height which is too small and/or in smeared adhesive structures.

Moreover, with some polymer-based materials, it is difficult to ensure an adequate flowability after the structuring. On structuring, the material often goes from a non-cross-linked condition into a cross-linked condition and/or the glass transition temperature increases. Moreover, photosensitive polymers are moreover pre-polymerised due to the light exposure in the course of a photolithographic structuring method, which results in a reduced flowability. Polymers which are not photo-sensitive are polymerised before their structuring, which can be effected by way of dry etching for example, and this polymerisation likewise causes a reduced flowability of the structures. The bonding capability of the polymer is also compromised by the at least partial polymerisation.

Methods, with which prominences, for example of silicon, glass or cured polymers are firstly pre-processed for creating structured adhesive layers with a certain, predefined thickness, are possible. These prominences or base structures are not deformable or are only difficultly deformable and can be produced by a conventional structuring method, for example photo-lithographically or by way of etching. These base structures which remain after the structuring and which only cover a small surface area of the wafer in comparison to the non-structured layer, are then coated with a thin, well flowable adhesive layer, also called cover layer. This coating is effected for example by way of transfer techniques such stamping an adhesive from a coated auxiliary wafer or from a coated roller or also way of spraying the base structure with the adhesive material. A structure which avoids too large a lateral pressing of the adhesive layer and simultaneously permits a compensation of the surface topography to the necessary extent is created by way of the suitable proportioning of the firm base structure and of the well flowable cover layer.

With certain methods, it is therefore necessary for the base structures to firstly be pre-processed and structured, before the cover layer of the well flowable adhesive is deposited. This demands much effort.

The present application provides an alternative, simplified method.

The bonding method for connecting a first and a second wafer comprises the depositing of a first adhesive layer onto a surface of the first wafer. The first adhesive layer can here be deposited by way of standard methods such as sputtering, blade deposition, laminating or spraying. The first adhesive layer can have a defined height of for example between 0.5 and 50 µm, preferably between 1 and 20 µm, particularly preferably between 5 and 10 µm.

The first adhesive layer can be deposited on the complete surface of the first wafer in an extensive (surfaced) manner or be deposited on a part-surface of the surface of the first wafer, said part-surface preferably being continuous (coherent). For example, a rim can be left out when depositing the first adhesive layer.

In a further method step, a second adhesive layer is deposited onto the first adhesive layer. The depositing of the second adhesive layer can likewise be effected for example by way of the standard methods mentioned in the preceding paragraph. The second adhesive layer can likewise have a defined height which is preferably significantly smaller than the height of the first adhesive layer, for example at the most half as high as the first adhesive layer or preferably maximally 20% of the height of the first adhesive layer. The second adhesive layer can have a height for example of less than 2 µm, preferably between 0.5-1 µm.

The second adhesive layer can be extensively deposited onto the first adhesive layer, so that the second adhesive layer completely covers the first adhesive layer, or the second adhesive layer can be deposited onto a preferably continuous part-surface of the first adhesive layer.

Here, the first and/or the second adhesive layer can preferably consist of a material which is suitable for adhesive bonding processes, for example of benzocyclobutene (BCB) or of another polymer.

In a further method step, the two adhesive layers are structured by way of selective removal of both adhesive layers in at least one predefined region of the first wafer.

The structuring can be effected for example by way of a laser, such as an excimer laser or by way of another ablative laser. Moreover, other structuring methods which are preferably suitable for structuring adhesives with a high flowability are suitable for the common structuring of the first and second adhesive layer.

Surfaces of the first wafer can be selectively exposed by way of the structuring of the adhesive layer. This can have various advantages with regard to the further processing. For example, a release of the adhesive connection at a later stage or a singularisation of the components located on the wafer can thus be simplified. The common structuring of both adhesive layers moreover simplifies the creation of the double adhesive layer, due to the fact that both adhesive layers can be extensively deposited by way of the same appliances. The costs can therefore be reduced by way of a common structuring.

In a further method step, the first wafer is connected to the second wafer by way of pressing a surface of the second wafer onto the second adhesive layer. The connecting of the wafers, which can also be termed as the joining, can be assisted by way of pressure upon the two wafers to be connected and/or additionally by way of a heat input or UV exposure.

On connecting the two wafers, the second adhesive layer is more flowable that the first adhesive layer, by which means it is only the second adhesive layer which noticeably runs, and thus the structure of the adhesive layers is largely preserved. Moreover, an improved bonding capability and thus a stable connection of both wafers can be achieved due to the good flowability of the second adhesive layer when connecting the two wafers.

The second adhesive layer is preferably significantly thinner than the first adhesive layer, and the thickness of the second adhesive layer before connecting the two layers is for example below 50%, preferably below 20% or below 10% with respect to that of the first adhesive layer.

If a running of the flowable second adhesive layer were now to occur on joining the two wafers, then the second adhesive layer is pressed out a little, for example at the edge of the base structures which arose from the first adhesive layer, or part of the second adhesive layer can flow down on the sides of the base structures. However, the second adhesive layer is preferably designed so thinly, that a running of the second adhesive layer, for example along the base structure, to onto the first wafer, is either improbable or is ruled out. The structures which are produced in the structuring step are thus at least approximately completely preserved.

Moreover, it is possible for the method according to the present application to comprise a further method step, with which the first adhesive layer is at least partly cured before depositing the second adhesive layer. Here, the curing can be effected by light, heat or the like, depending on the material present. In this case, the second adhesive layer is deposited onto the partly cured first adhesive layer after the at least partial curing of the first adhesive layer, and the two adhesive layers of a different flowability and/or curing degree are subsequently commonly structured.

With the described method, the procedure is preferably in the following sequence:

Firstly, the two adhesive layers are deposited onto the first wafer either successively or simultaneously.

The first adhesive layer can preferably be cured at least partly, the before the depositing of the second adhesive layer. The first adhesive layer can be or become at least partly cured already on depositing, in the case of a common depositing of both adhesive layers.

The two adhesive layers are subsequently simultaneously and/or commonly structured.

A second wafer is connected to the first wafer by way of pressing the second wafer onto the second adhesive layer, after the structuring of the two adhesive layers. The second adhesive layer is more flowable that the first adhesive layer at the point in time of the connecting of the two wafers.

The common structuring of the two adhesive layers can preferably be effected by way of laser ablation, for example with an excimer laser for removing structures, with a precision of below 2 µm. Alternatively, other structuring methods which are suitable for structuring materials with a high flowability and/or for the simultaneous structuring of several layers of different flowabilities can also be applied.

Moreover, it is possible for the first and the second adhesive layer to be simultaneously deposited onto the first wafer, for example by way of laminating on a premanufactured, two-ply adhesive layer. It is also possible to have already begun with the depositing of the second adhesive layer before the first adhesive layer is completely deposited. The coating process can be simplified and/or accelerated by way of an at least partial simultaneous depositing of the two adhesive layers.

The depositing of the first adhesive layer onto the first wafer and/or the depositing of the second adhesive layer onto the first adhesive layer is preferably effected in a uniform and/or gapless manner. A uniform and/or gapless deposition is rendered possible by way of the methods for depositing an adhesive layer which are mentioned above.

A uniformly deposited adhesive layer can be planar, in particular on the side which is away from the first wafer, wherein it is possible for the first adhesive layer to have different thicknesses at two different locations due to a surface topography of the first wafer. The second adhesive layer is preferably planar on both sides and thus preferably has a constant thickness before the structuring.

It is also possible for a surface topography with prominences between 0.5 and 10 µm to be present on the second wafer, at the side which comes into contact with the second adhesive layer on connecting, and for the second adhesive layer to be deposited at least so thickly, that the second, flowable adhesive layer flows around the surface topography of the second wafer in a complete manner, on connecting the first wafer to the second wafer. The first, less flowable adhesive layer can simultaneously form a stopper structure which ensures a minimum distance between the two wafers.

It is possible for the two adhesive layers to consist of the same material with different degrees of curing. For example, both layers can consist of BCB or another polymer, wherein the first adhesive layer is at least partly cured after the depositing, or the material can be deposited already in different stages (degrees) of curing. A particularly homogenous adhesive layer forms at the end of the bonding method, after the connecting of the two wafers and the complete curing of both adhesive layers, when using the same material in different stages of curing.

It is also possible to manufacture the first and the second adhesive layer of different materials. Here, it is also possible for the material of the first adhesive layer to be at least partly cured before the depositing of the second adhesive layer, or for the material of the first adhesive layer to have a reduced flowability compared to the material of the second layer, already on or before the depositing The application of different materials or materials which have different flowabilities already when being deposited can simplify and/or accelerate the depositing method, due to the fact that one can make do without curing step for example and/or that the materials can be deposited at least partly simultaneously, as described above.

Apart from wafers, the described method is also suitable more generally for circuit carriers, substrates or similar structures.

The present application moreover also includes a double adhesive layer which has been manufactured as described above. The use of a double adhesive layer manufactured by the described method can be at least partly deduced from a transverse section of the finished product, if clear structures and/or different adhesive materials are recognisable.

BRIEF DESCRIPTION OF THE DRAWINGS

Further embodiments of the described method are hereinafter described by way of the figures. Here are shown in.

DETAILED DESCRIPTION

Figure 1A:
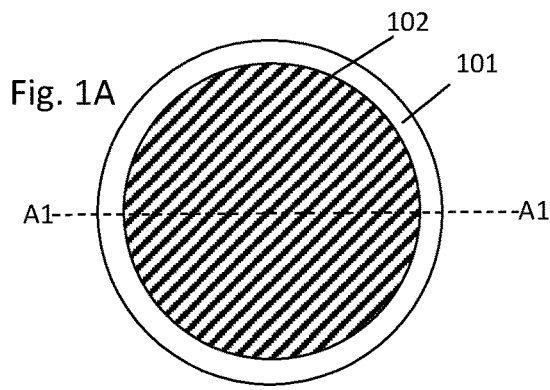
FIG. 1A a plan view of a first wafer coated with a first adhesive layer.

FIG. 1A shows a round, first wafer 101, which, whilst leaving out a rim, is extensively coated with a first adhesive layer 102. The first adhesive layer 102 consists of a polymer and/or thermoplastic material, such as BCB for example, and was deposited onto the first wafer 101 by way of spin-coating. The first adhesive layer 102 is thus planar on the side which is away from the first wafer 101, but can also have different thicknesses due to the surface structures of the first wafer 101. The thickness of the first adhesive layer 102 is selected such that the surface structures of the first wafer 101 are completely covered.

Figure 1B:
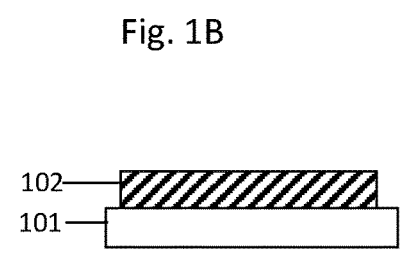
FIG. 1B a cross section of the object of FIG. 1A.

FIG. 1B shows the first wafer 101 as well as the first adhesive layer 101 according to FIG. 1A, in a cross section along line A1. Here, it can be recognised that the first adhesive layer 102 forms a gapless and uniform layer which is planar at the side which is facing away from the first wafer 101.

After the depositing of the first adhesive layer 102, this is at least partly cured and pre-polymerised. The flowability of the first adhesive layer 102 reduces on account of this.

Figure 2A:
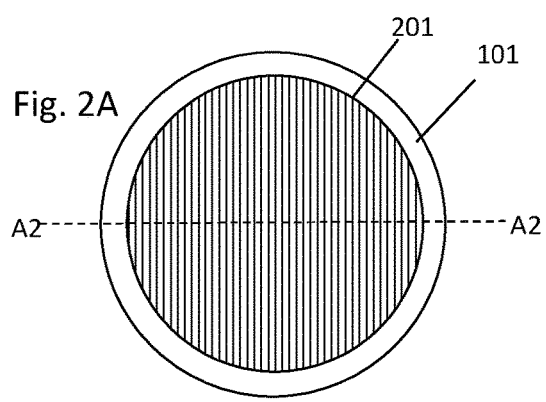
FIG. 2A a plan view of the wafer of FIG. 1A, which is additionally coated with a second adhesive layer, FIG. 2B a cross section of the object of FIG. 2A, FIG. 3A a plan view of the wafer of FIG. 2A, after a structuring step, FIG. 3B a cross section of the object of FIG. 3A, FIG. 4 a cross section of the wafer of FIG. 3B, after a connecting to a second wafer and FIG. 5 a cross section of the wafer of FIG. 3B, after the connecting to a second layer having a surface topology.

FIG. 2A shows the intermediate product after the next method step, with which a second adhesive layer 201 has been deposited onto the layered wafer of FIG. 1A. The second adhesive layer 201 is again deposited in a uniform and gapless manner and completely covers the first adhesive layer. Alternatively, the second adhesive layer 201 could also being uniformly deposited only onto a simply continuous part of the first adhesive layer 102.

Figure 2B:
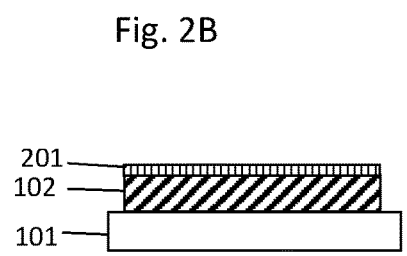

As can be recognised in the cross section along line A2 in FIG. 2B, the second adhesive layer 201 is planar on both sides and thus has a constant thickness. Slight deviations caused by production are here likewise considered as being planar in the context of the present application. Moreover, the second adhesive layer 201 is significantly thinner than the first adhesive layer 102.

The second adhesive layer 210 likewise consists of BCB in the non-polymerised condition and due to this has a higher flowability that the already pre-polymerised first adhesive layer 102.

Alternatively, the second adhesive layer can also be manufactured of another thermoplastic material and/or of other polymers.

Figure 3A:
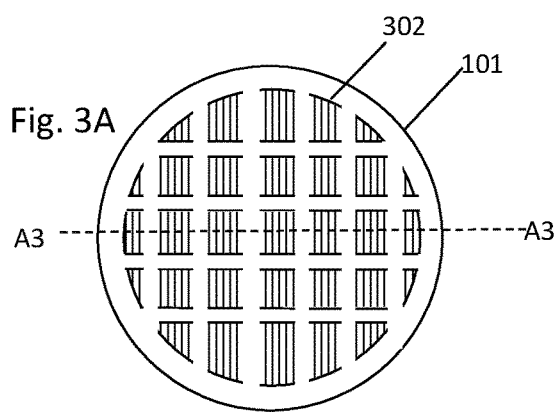
Figure 3B:
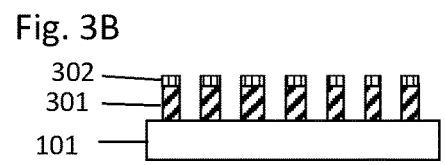

FIG. 3B shows the intermediate product after a further method step, in which both adhesive layers have been structured by way of laser ablation. Here, the molecules of the adhesive layers are excited and removed in predefined regions of the first wafer in a selective and highly precise manner, by way of a laser, for example an excimer laser.

Only the structured second adhesive layer 302 can be recognised in the plan view of FIG. 3A, whereas the cross section along the line A3 and represented in FIG. 3B shows the two-layered adhesive structures which consist of a structured first adhesive layer 301 as well as of a structured second adhesive layer 302.

Figure 4:
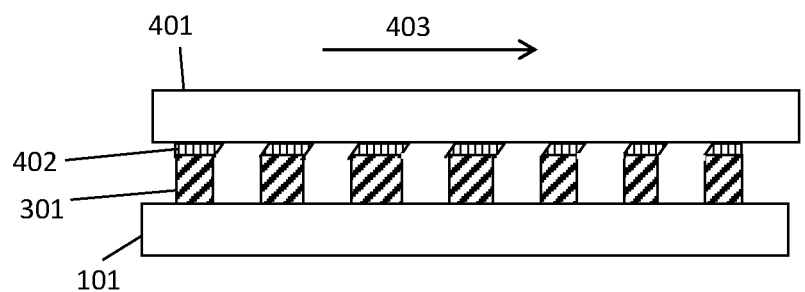

FIG. 4 shows the connecting of the layered, structured wafer of FIG. 3A, 3B to a second wafer 401. The connecting is effected at an increased temperature, by way of pressing the second wafer 401 onto the second adhesive layer 402 which is at least slightly deformed by way of this pressing. The occurrence of a slight lateral material pressing is possible when pressing on the second wafer 401, and the second wafer 401 is displaced in a direction 403 due to the high flowability of the second structured adhesive layer 302, 402. However, since the structured first adhesive layer 301 does not deform or only to a slight extent, under the applied pressure, only small displacements occur, due to the small thickness of the second adhesive layer 302 and the reduced flowability of the structured first adhesive layer 301. The structure of the structured adhesive layers 301, 302 in FIG. 3A, 3B are therefore largely preserved, since only small quantities of the second adhesive layer 302 run due to the applied pressure, and, as the case may be, runs down on the base structure defined by the first structured adhesive layer 301.

Figure 5:
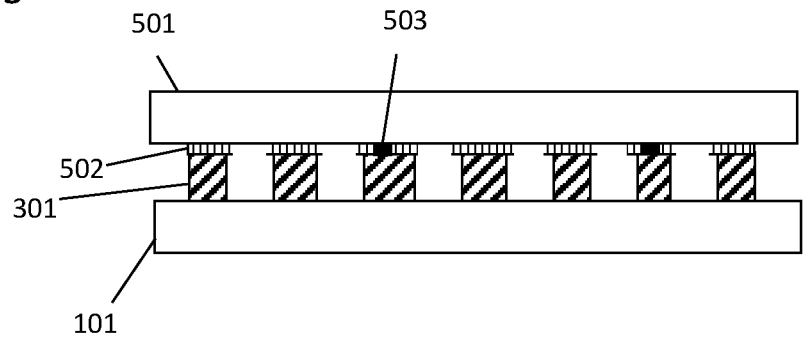

The connecting of a second wafer 501 which has a surface topography in the form of prominences 503, to the structured wafer shown in FIG. 3A, 3B, is represented in FIG. 5. A slight material pressing of the structured second adhesive layer 502 likewise occurs here. The thickness of the second adhesive layer is here selected such that it is at least as thick as the highest prominence 502 of the surface topography of the second wafer 501. The second adhesive layer can therefore flow around and enclose the surface topography in a complete manner, but the predefined structure is largely preserved due to the more solid/rigid base structures of the structured first adhesive layer.

The two adhesive layers are completely cured after the connecting of the two wafers. The two wafers are thus permanently connected and can be commonly processed. A later separation of the two wafers is preferably not envisaged.

A differentiation of the applied layers after the curing of the two adhesive layers is extremely difficult or not even possible at all, under certain circumstances, particularly if the same material has been used for both adhesive layers. Above all, it is the clear structures of a cured adhesive layer between wafers in combination with slightly run structures at the end of the adhesive layer which point towards an application of the method described here. However, similar features of the adhesive layer can also result from other methods for connecting two wafers.

It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled.

This application relates, inter alia, to the following examples:

1. A bonding method for connecting a first wafer and a second wafer, comprising the following steps:
   depositing a first adhesive layer onto a surface of the first wafer,
   depositing a second adhesive layer onto the first adhesive layer,
   structuring the two adhesive layers by way of selective removal of both adhesive layers in at least one predefined region of the first wafer,
   connecting the first wafer to the second wafer by way of pressing a surface of the second wafer onto the second adhesive layer,
wherein the second adhesive layer is more flowable than the first adhesive layer, on connecting the first wafer to the second wafer.

2. The method according to example 1, further comprising an at least partial curing of the first adhesive layer, before the depositing of the second adhesive layer.

3. The method according to one of the preceding examples, wherein the structuring is effected at least partly by laser ablation.

4. The method according to one of the examples 1 and 2, wherein the first and/or the second adhesive layer consists of a material which is suitable for adhesive joining processes, such as benzocyclobutene or another polymer.

5. The method according to one of the preceding examples, wherein the two adhesive layers are deposited simultaneously.

6. The method according to one of the preceding examples, wherein the depositing of the first adhesive layer onto the surface of the first wafer and/or the depositing of the second adhesive layer onto the first adhesive layer is effected in a uniform and/or gapless manner 7. The method according to one of the preceding examples, wherein the first and/or second adhesive layer is planar at the side which is away from the first wafer.

8. The method according to one of the preceding examples, wherein a surface topology is present on the surface of the second wafer, and the second adhesive layer is deposited at least as thickly as the highest point of the surface topology.

9. The method according to one of the preceding examples, wherein the first and the second adhesive layer consist of the same material in different degrees of curing.

10. The method according to one of the examples 1-7, the first and the second adhesive layer consist of different materials.

11. A structured double adhesive layer, manufactured according to the method according to one of the preceding examples.

The claimed invention is:

1. A bonding method for connecting a first wafer and a second wafer, comprising the following steps:
   depositing a first adhesive layer onto a surface of the first wafer,
   depositing a second adhesive layer onto the first adhesive layer,
   structuring the two adhesive layers by way of selective removal of both adhesive layers in at least one predefined region of the first wafer,
   connecting the first wafer to the second wafer by way of pressing a surface of the second wafer onto the second adhesive layer,
wherein the second adhesive layer is more flowable than the first adhesive layer, on connecting the first water to the second wafer.

2. The method according to claim 1, further comprising an at least partial curing of the first adhesive layer, before the depositing of the second adhesive layer.

3. The method according to claim 1, wherein the structuring is effected at least partly by laser ablation.

4. The method according to claim 1, wherein the first and/or the second adhesive layer consists of a material which is suitable for adhesive joining processes, including benzocyclobutene or another polymer.

5. The method according claim 1. wherein the two adhesive layers are deposited simultaneously.

6. The method according to claim 1, wherein the depositing of the first adhesive layer onto the surface of the first wafer and/or the depositing of the second adhesive layer onto the first adhesive layer is effected in a uniform and/or gapless manner.

7. The method according to claim 1, wherein the first and/or second adhesive layer is planar at the side which is away from the first wafer.

8. The method according to claim 1, wherein a surface topology is present on the surface of the second wafer, and the second adhesive layer is deposited at least as thickly as the highest point of the surface topology.

9. The method according to claim 1, wherein the first and the second adhesive layer consist of the same material in different degrees of curing.

10. The method according to claim 1, wherein the first and the second adhesive layer consist of different materials.

11. A structured double adhesive layer, manufactured according to the method according to claim 1.

12. A bonding method for connecting a first wafer and a second wafer, comprising the following:
   depositing a first adhesive layer onto a surface of the first wafer;
   depositing a second adhesive layer onto the first adhesive layer after at least partial curing of the first adhesive layer;
   structuring the two adhesive layers by way of using laser ablation for selective removal of both adhesive layers in at least one predefined region of the first wafer;
   connecting the first wafer to the second wafer by way of pressing a surface of the second wafer onto the second adhesive layer;
   wherein the second adhesive layer is more flowable than the first adhesive layer, on connecting the first wafer to the second wafer; and
   wherein the first and/or the second adhesive layer includes a material that is suitable for adhesive joining processes, including at least one of benzocyclobutene or another polymer.

13. The method according claim 12, wherein the two adhesive layers are deposited simultaneously.

14. The method according to claim 12, wherein the depositing of the first adhesive layer onto the surface of the first wafer and/or the depositing of the second adhesive layer onto the first adhesive layer is effected in a uniform and/or gapless manner.

16. The method according to claim 1, wherein the first and/or second adhesive layer is planar at the side which is away from the first wafer.

16. An article comprising:
   a first wafer;
   a second wafer, bonded to the first wafer by a first adhesive layer deposited onto a surface of the first wafer, a second adhesive layer deposited onto the first adhesive layer, the two adhesive layers structured by selective removal of both adhesive layers in at least one predefined region of the first wafer, the first wafer connected to the second wafer by pressing a surface of the second wafer onto the second adhesive layer, when the second adhesive layer is more flowable than the first adhesive layer, on connecting the first wafer to the second wafer.

* * * * *